(12) United States Patent
Ahearn et al.

(10) Patent No.: US 6,970,279 B2
(45) Date of Patent: Nov. 29, 2005

(54) OPTICAL BEAM MODULATING SYSTEM IMPLEMENTING THE USE OF CONTINUOUS TUNABLE QWIMS

(75) Inventors: John S. Ahearn, Amherst, NH (US);
Mani Sundaram, Nashua, NH (US);
Axel Reisinger, Milford, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 26 days.

(21) Appl. No.: 10/698,877

(22) Filed: Oct. 30, 2003

(65) Prior Publication Data
US 2004/0095627 A1    May 20, 2004

Related U.S. Application Data

(63) Continuation-in-part of application No. 10/145,073, filed on May 13, 2002, now Pat. No. 6,665,111.

(51) Int. Cl.$^7$ ............................................... G02F 1/01
(52) U.S. Cl. ........................................ 359/240; 359/321
(58) Field of Search ............................. 359/240, 245, 359/290, 298, 299, 321; 257/21, 184, 440; 372/12; 385/8

(56) References Cited

U.S. PATENT DOCUMENTS 4,903,101 A    2/1990  Maserjian 6,353,624 B1    3/2002  Pelekanos et al.
2002/0067535 A1 *  6/2002  Trezza ........................ 359/298

OTHER PUBLICATIONS

Goldys et al, "Operation and Theoretical Analysis of the Multiple Asymmetric Coupled Quantum-Well Light Modulator in the n-i-n Configuration", IEEE J. of Quantum Electronics, vol. 33, No. 7, Jul. 1997, p. 1084.*

* cited by examiner

Primary Examiner—Scott J. Sugarman
Assistant Examiner—Richard Hanig
(74) Attorney, Agent, or Firm—Barry L. Haley; Daniel J. Long

(57) ABSTRACT

The present invention relates to an optical modulator array that uses stepped-well continuously tunable quantum well infrared modulators in order to accomplish electronic beam modulating. The present invention involves a coherent optical beam modulating device to steer an optical beam comprising: an optical modulator array, where said optical modulator array includes a stepped quantum well doped with electrons, wherein the modulator array affects operates as at least one of a phase modulator and a light intensity modulator base upon a voltage bias applied across the modulator array. The continuous tunable quantum well modulator includes asymmetry of the unit cell that allows transitions from the ground state to the second excited state that are normally forbidden in symmetrical quantum well infrared photodetectors.

12 Claims, 9 Drawing Sheets

2D Array of QWIMs to affect 2D Beam Steering

OPTICAL BEAM MODULATING SYSTEM IMPLEMENTING THE USE OF CONTINUOUS TUNABLE QWIMS

CROSS REFERENCE TO RELATED APPLICATIONS

This application is a continuation in part of U.S. application Ser. No. 10/145,073, filed on May 13, 2002, now U.S. Pat. No. 6,665,111.

BACKGROUND OF THE INVENTION

1. Field of the Invention

The present invention relates to the use of a coherent optical beam modulating system that utilizes continuously tunable stepped-well quantum well infrared modulators.

2. Description of Related Art

Many methods exist that accomplish the deflection and steering of optical signals. The most common methods employ a mechanical means to accomplish the directional modification of an optical beam or spatial patterns of illumination produced by lasers. Spatial light modulators of the prior art have been more recently replaced with quantum well devices. The quantum well devices used for light modulation provide smaller spatial light modulators where diffraction effects dominate, have fast response times and can be made lithographically using standard fabrication equipment. Beam steering devices have implemented the optical modulators where the phase of lightwaves is altered by illumination of semiconductors. The spatial light modulators function by optically inducing changes in the semiconductor material which affect an adjacent layer of electro-optic material which in turn affects EM wave propagating through the electro-optic material.

Spatial light modulators include the use of phased array antennas that transmit EM waves in a particular direction in the microwave region without moving parts. The phased array antennas electronically change the phases of the signals radiating from each element. Accordingly, electronic beam steering provides a faster and more agile steering method as opposed to mechanical beam steering and facilitates multiple target tracking by forming several beam lobes and nulls. The use of phased array antennas possesses some drawbacks such as diminished control of each element that requires the use of a power splitting network which increases cost and size. Furthermore, large arrays require significant computations in order to calculate array phase distribution.

U.S. patent application Ser. No. 10/145,073 to Sundaram (Sundaram), incorporated by reference, describes an electronically steered laser beam that uses an absorption modulator for electronic beam steering. The device of the Sundaram application operates as a mirror in the reflection mode and an optical medium in the transmitter mode. An integrated circuit or chip reflects the laser beam in a reflection mode by varying the voltage of the chip. In the alternative transmitting mode, the chip transmits the laser beam according to the applied voltage. Sundaram describes the use of an optical modulator array formed on a substrate with a quantum well doped with electrons. Discrete voltage signals are applied to the modulator to control an exit angle of one or more exit beams from the modulator. The modulator operates by using intersubband transitions in the 3–5 micron range for countermeasures applications.

Intersubband transitions have sharp absorption lines with spectral widths $\Delta\lambda/\lambda$ (Full-width-half-maximum/Peak-wavelength) as low as 8%. On the other hand, interband absorption has undesirably wide spectral width and in the 3–5 micron wavelength range is hampered by the lack of a semiconductor system with the properties required to achieve voltage-tunable absorption. Quantum well absorption of 3–5 micron wavelength is possible in one embodiment using lattice-matched InGaAs/InAlAs quantum wells on InP. It is also possible to have proper operational characteristics in another embodiment using strained InGaAs/GaAs/AlGaAs quantum wells on GaAs substrate.

The ability to change the quantum well absorption with applied voltage is possible by charge transfer to and from the quantum wells capacitively. An alternate method to tune quantum well absorption is called the Stark effect and relies on tuning the energy levels in the quantum well with voltage, thereby changing the absorption peak, which is equal to the separation between the two lowest energy levels. This effect is generally very small, particularly at non-cryogenic temperatures, such as room temperature, with the resulting absorption modulation too small to make a practical device.

An array of absorption modulators may be formed on a substrate wherein the absorption spectrum changes with the voltage bias. In some instances, the absorbers are inserted in the resonant cavity. The absorption changes with the voltage per pixel; the phase changes with the voltage per pixel; the amplitude changes with the voltage per pixel (ideally zero); and therefore, the beam angle changes with an array voltage pattern.

In regard to standard quantum well infrared photodetectors (QWIP), QWIPs rely on a symmetrical structure design involving a series of quantum wells and barrier layers grown sequentially. The center of symmetry lies at the center of each quantum well, therefore such structures should in theory respond identically to a bias of either polarity. In particular, their spectral response should have at best a second-order dependence on the applied bias. FIGS. 1A and 1B depict experiments that indeed confirm that conventional QWIP's have a very weak dependence of the peak wavelength on applied bias, at least over the few volts afforded by normal read-out integrated circuits (ROIC).

U.S. Pat. No. 6,353,624 to Pelekanos et al. (Pelekanos) relates to a semiconductor laser with a tunable gain spectrum. The tuning principle of Pelekanos is based on a modulation by an electro-optical effect such as the quantum confined Stark effect of the gain spectrum of the diode during the emission of the laser radiation. The wavelength of the laser radiation is directly controlled by the current injected into the laser diode.

U.S. Pat. No. 4,903,101 to Maserjian (Maserjian) relates to an infrared detector characterized by photon-assisted resonant tunneling between adjacent quantum wells formed in a semiconductor structure, wherein the resonance is electrically tunable over a wide band of wavelengths. The quantum well structure of Maserjian comprises at least one quantum well sandwiched by two barrier layers and formed in an intrinsic layer comprising an III–V semiconducting material.

In order to create a quantum well infrared modulator (QWIM), one must break the bilateral symmetry of the quantum well structure by incorporating some irregularity into the design of the unit cell. The asymmetry allows a first-order dependence of the peak wavelength on applied bias. QWIMs are created in two fashions. The first approach involves designing a unit cell composed of two separate but closely spaced quantum wells, each with its own distinct spectral response. The energy bands tilt by means of an applied bias in such a way that the electrons transfer from one well to the other, leading to discontinuous or bimodal spectral tunability. The second approach involves an asymmetrically stepped quantum well in which the separation between the ground state (E1) and the first excited state (E2) changes linearly with applied bias.

SUMMARY OF THE INVENTION

The present invention relates to an optical modulator that uses stepped-well QWIMs in order to modulate either the light intensity or phase of the light. The QWIM includes asymmetry of the unit cell that allows transitions from the ground state to the second excited state that are normally forbidden in symmetrical QWIPs. The QWIM contemplated by the present invention exhibits double absorption peaks where the relative strength depends on the applied bias and the absorption peaks. The phase modulator of the present invention operates without a change in light intensity, and thus the loss of light may be limited when operating in this capacity.

The present invention utilizes a variety of asymmetric inter-sub-band structures that allow the spectral absorption to change with the applied field. An electrical field induces the change in the state of the modulator. The quantum wells of the present invention enables the QWIM to function as either a modulator of light intensity or a phase modulator within a narrow spectral band. The reflective properties of the modulator change and enable the phase or amplitude of the light reflecting off of the surface, i.e., a reflection modulator, or passing through the modulator, i.e., a transmission modulator, to be controlled and readily changed.

It is therefore an object of the present invention to provide a coherent optical beam modulating device to steer an optical beam comprising: an optical modulator array, where said optical modulator array includes a stepped quantum well doped with electrons, wherein the modulator array operates as at least one of a phase modulator and a light intensity modulator base upon a voltage bias applied across the modulator array.

It is also an object of the present invention to provide a system for coherent optical beam modulating comprising: an optical signal, where the optical signal is at least one of a transmitted signal and a reflected signal; and at least one hybridized array capable of reflecting and transmitting the optical signal, where the hybridized array continuously affects the optical signal with respect to a voltage bias applied across the at least one hybridized array.

In accordance with these and other objects which will become apparent hereinafter, the instant invention will now be described with particular reference to the accompanying drawings.

DETAILED DESCRIPTION

The present invention relates to a quantum well that offers modulation of the detected spectrum of the intersubband separation changes that change with the voltage bias. The present invention addresses problems associated with the discontinuous tunability (bimodal), as known in the prior art, specifically related to peak responses that suddenly jump from a given wavelength to another upon changing the applied bias voltage. Normally, discontinuous tunability involves two closely coupled quantum wells where each has its own distinct spectral response. The QWIMs of the current invention reach the peak response gradually and monotonically with applied voltage and rely on an asymmetric stepped quantum well design.

Figure 1A:
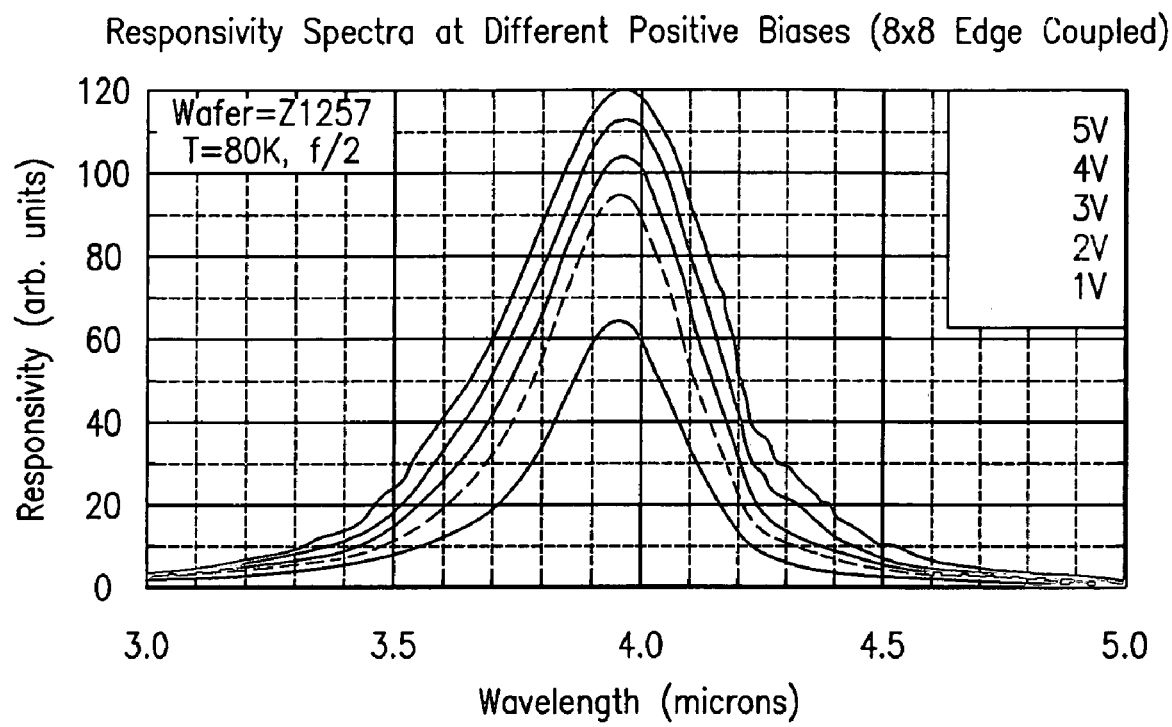
FIG. 1A shows a graph of responsivity spectra at positive biases of a symmetric quantum well.
Figure 1B:
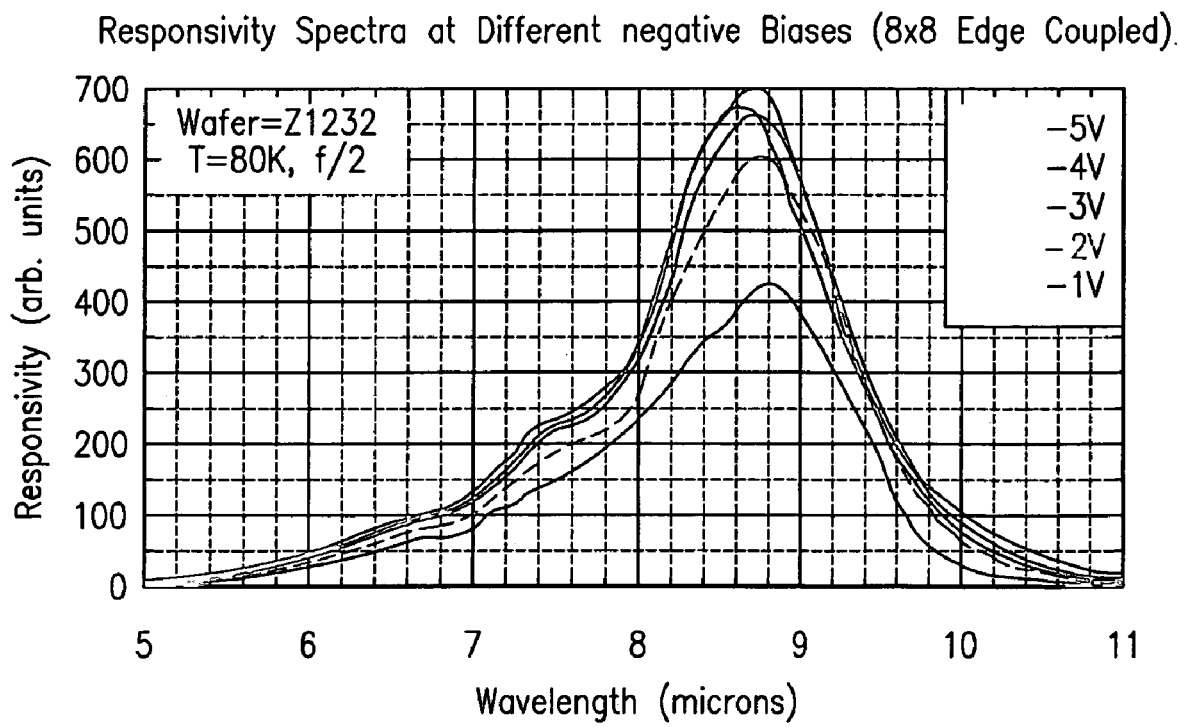
FIG. 1B shows a graph of responsivity spectra at negative biases of another symmetric quantum well.
Figure 2:
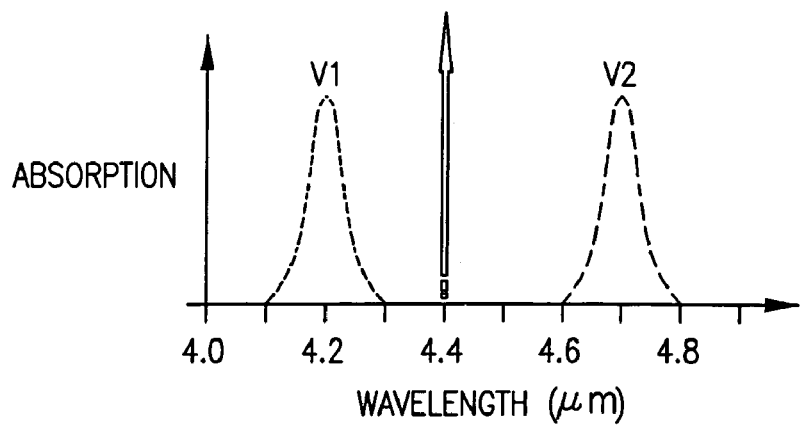
FIG. 2 shows idealized absorption curves at two wavelengths of a bimodal QWIM at two different biases for a phase modulation application.
Figure 3:
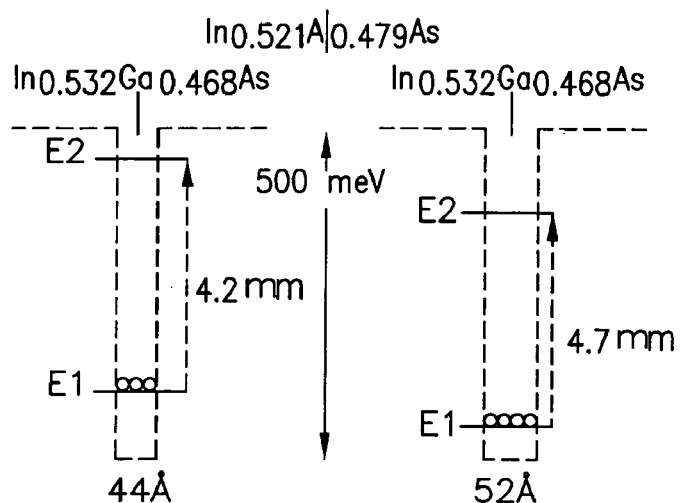
FIG. 3 shows the quantum well properties for the 4.2 microns wavelength and the 4.7 wavelength quantum wells.

Referring to FIGS. 2 and 3, a graphical representation of the absorption waveforms for a phase modulation application is shown. The graphs show absorption versus wavelength and one may clearly ascertain that the absorption spectrum depends on the applied voltage. All 4.2 micron light is absorbed at voltage V1 and all 4.7 micron light is absorbed at voltage V2. Accordingly, an optical beam at an intermediate wavelength such as 4.4 microns will experience a dramatic phase shift upon being reflected. This phase shift of the optical beam depends on the actual voltage applied across the device. In this exemplary embodiment, the device does not absorb any of the laser light at 4.4 microns and reflects the beam in its entirety. The phase of the reflected beam, however, changes by virtue of having an absorption peak on either side of the laser wavelength. The relationship between this absorption spectrum and the phase change produced at the laser wavelength is calculated through a Kramers-Kronig analysis, as is well known in the art.

It is, therefore, apparent for applications other than phase modulation, such as amplitude modulation, only a single absorption wavelength is necessary. For an optical beam at 4.4 microns, the device will have an absorption peak at 4.4 microns with a voltage-controlled absorption such that at a voltage V1 all 4.4 micron light is absorbed and at a voltage V2 no 4.4 micron light is absorbed (i.e. all the light is reflected). Partial absorption/reflection occurs at intermediate values of voltage.

Figure 4A:
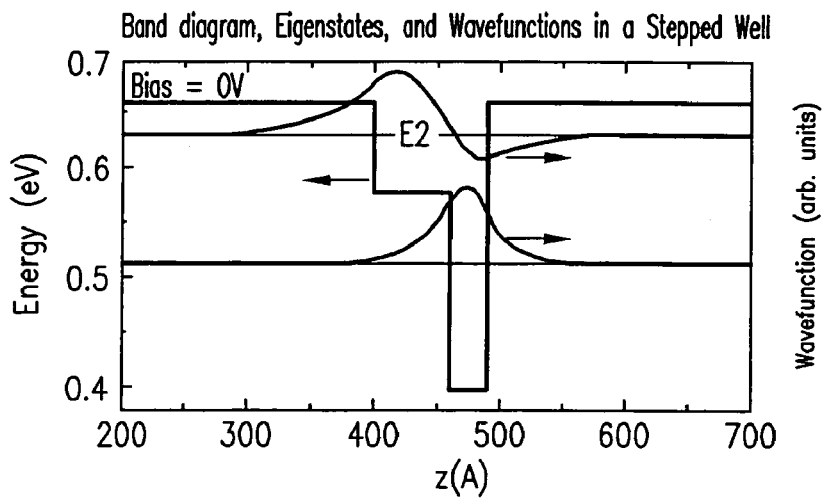
FIG. 4A shows an exemplary band diagram of an asymmetric continuous tunable stepped quantum well.

Referring to FIG. 4A, the asymmetric stepped well demonstrates the best characteristics to achieve the quantum well as contemplated by the present invention. FIG. 4 clearly shows that the ground state, advantageously, does not move with bias; however the excited state changes continuously with the bias. The intersubband separation ΔE is given simply by $\Delta E = F[<1|z|1> - <2|z|2>]$, where F is the applied electrical field and a term in square brackets is the separation between the ground excited state wave functions. The symmetric well of FIG. 2 shows that when the two wave functions are centered, the bracketed collapses to zero and no tunability is expected or observed. Quantum efficiency depends upon the overlap of the two wave functions, $<1|z|2>$. The overlap of the two wave functions is maximize in the symmetric wells and decreases with decreasing symmetry. The QWIM may be optimized so as to achieve effective phase or light intensity modulation while still maintaining acceptable absorption strength. The characteristics of the present QWIM address the demands of a large wave function separation and provide acceptable levels of absorption strength. In order to ensure proper functionality of the QWIM, the excited state |2> must tune with bias and, therefore, needs to be bound. The excited state needs to be below the surrounding barriers in order to prevent the ceasing of the ability to change with bias.

Figure 4B:
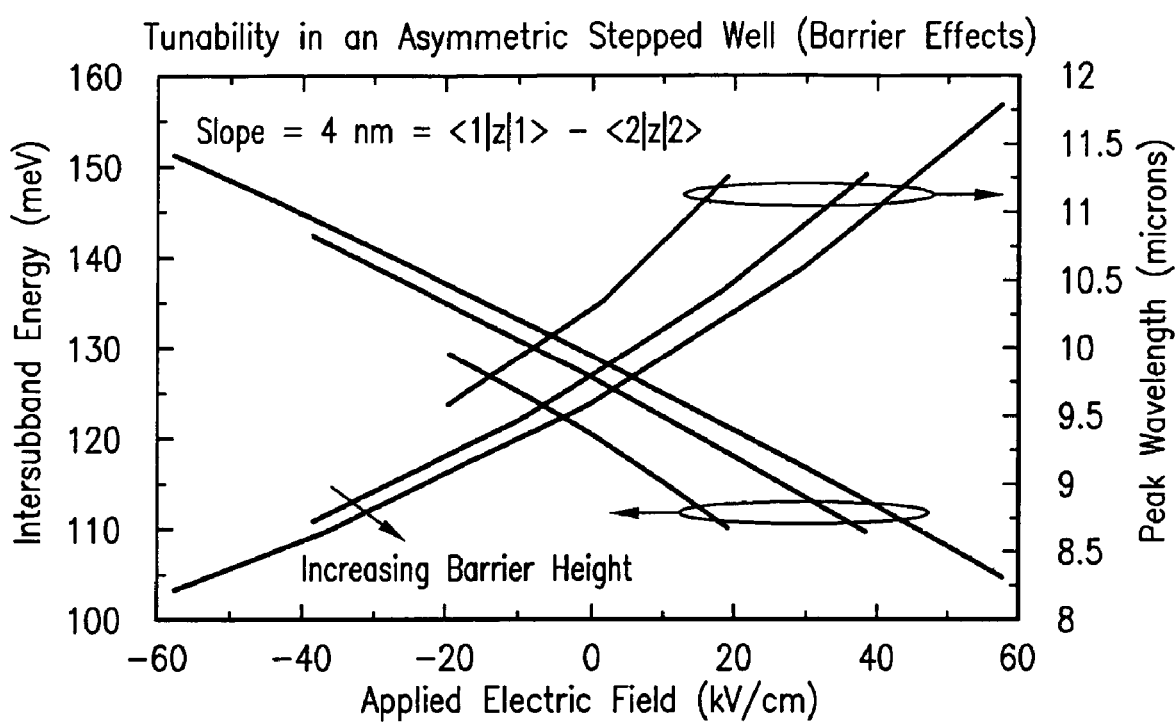
FIG. 4B shows an exemplary graph for tunability of an asymmetric stepped well according to the present invention.

Referring now to FIG. 4B, a graph depicting the tunability of an asymmetric step well for different barrier heights is displayed. FIG. 4B demonstrates that tunability increases with the increasing barrier height. The tunability of the present invention is calculated via a solution of the Schrodinger wave equation for the structure in FIG. 4A at different fields and in FIG. 4B for different barrier heights.

Figure 5A:
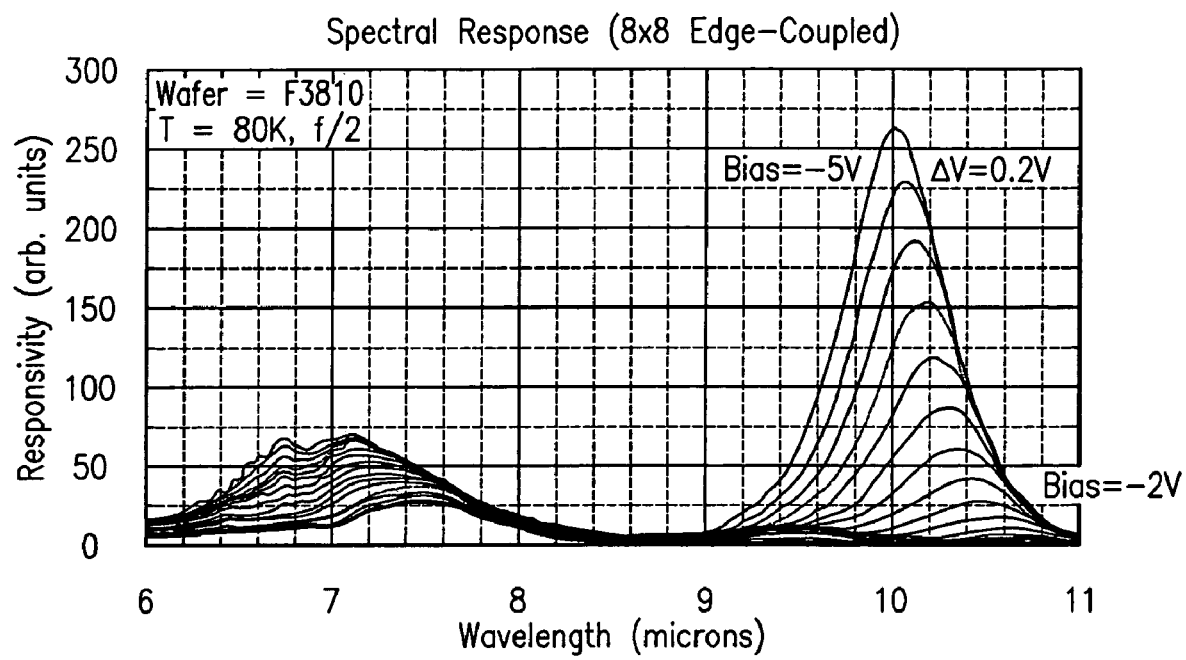
FIG. 5A shows an exemplary graph of the spectral response of a continuous tunable QWIM with modulation doped wells and MBE growth according to the present invention.
Figure 5B:
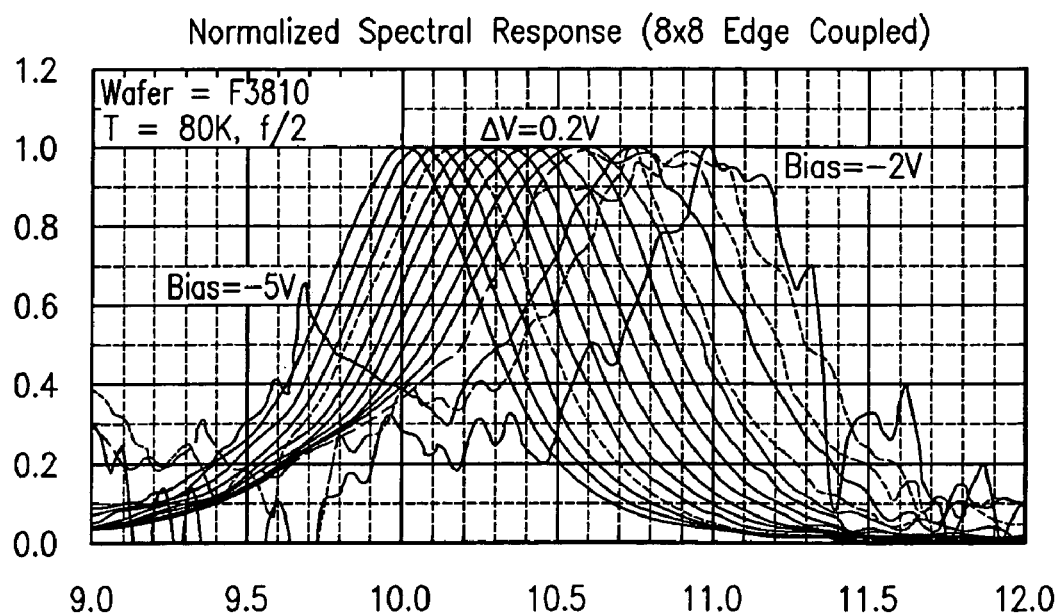
FIG. 5B shows an exemplary graph of the normalized spectral response of a continuous tunable QWIM with modulation doped wells and MBE growth according to the present invention.

Referring now to FIGS. 5A and 5B, the spectral response of an exemplary embodiment of the tunable QWIM is depicted. Molecular beam epitaxy (MBE) growth interrupts may be placed at the quantum well interfaces and modulation doping of a portion of the barriers instead of the quantum wells may be implemented in order to sharpen spectral response as shown FIGS. 5A and 5B. The above steps contribute to the interface roughness scattering and ionized impurities scattering along with spectral broadenings which is minimized, and thus provides the intrinsic spectral line width of the QWIM design where the line width is dominated by a finite lifetime and escape probability of electrons residing in the excited energy state. Wafer F3810 may be used to implement the exemplary embodiment. The wafer F3810 features a 40-Angstrom wide GaAs quantum well bound to 80-Angstrom wide ledge of $Al_{0.20}Ga_{0.80}As$ to one side. The undoped well/ledge pair is flanked on either side by 500-Angstrom wide $Al_{0.30}Ga_{0.70}As$ barriers. The barrier on the ledge side is modulation-doped (2e11 cm-2 sheet concentration of Si) in a δ-layer located 100 Angstroms away from the edge of the ledge, where the pattern is repeated for a total of 20 periods. The exemplary embodiment of FIGS. 5A and 5B may be tunable based on an applied bias of −2V to −5V, however the design may be modified so that tuning occurs from 0V to −2V. A commercial 320×256 ROIC may be used to apply a bias in the range of about 0V to −2.5V to the hybridized array. Alternate structures utilizing fewer quantum wells can be designed to provide similar tuning capabilities over a narrower range of applied biases, at the cost of reduced absorption strength. Referring to FIG. 5A, the optimal wavelength range for beam steering applications is between 8 and 9 μm, where changes in refractive index induced by changes in absorption in the two main bands remain sizeable (by virtue of the Kramers-Kronig relations), and yet the attenuation coefficient is suitably low to allow for a significant fraction of the incident light intensity to exit the device. For intensity modulation applications, on the other hand, the preferred wavelengths are either 7 μm or 10 μm, near the continuously tunable peak of either absorption band.

Figure 6A:
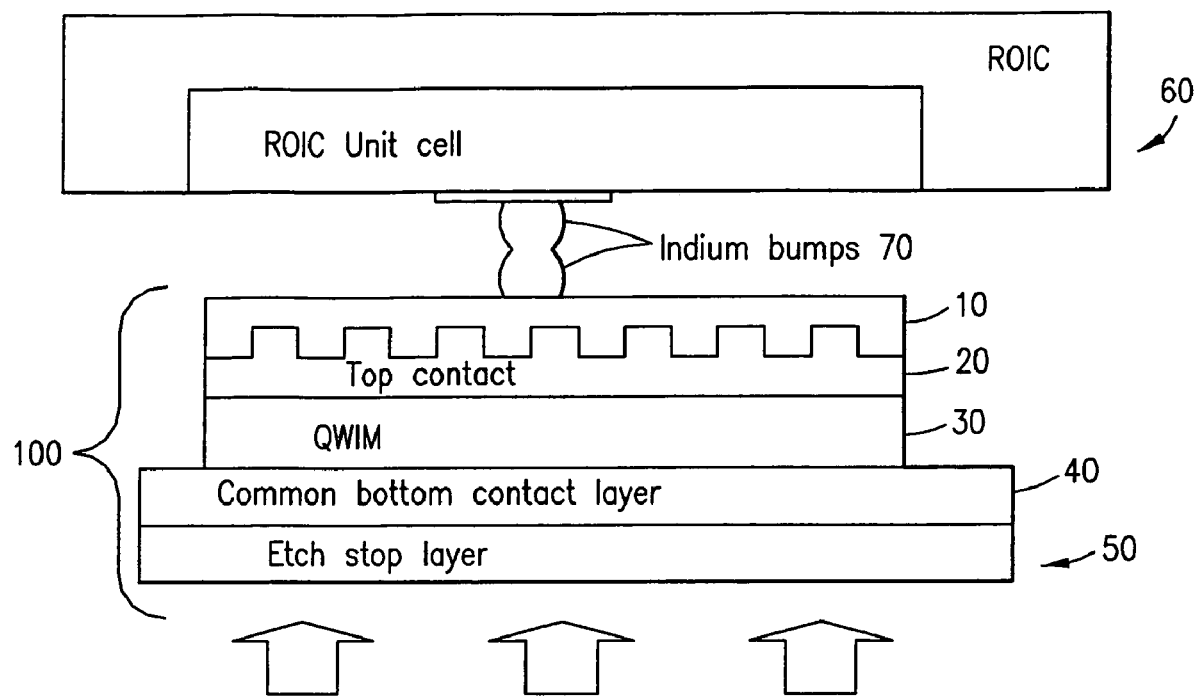
FIG. 6A shows an exemplary structural schematic of a hybridized array according to the present invention.

Referring now to FIG. 6A, an exemplary structural schematic of a hybridized array according to the present invention is shown. FIG. 6A shows a two-dimensional grating structure which may be dry etched into the top contact layer of the wafer. The grating in one exemplary embodiment may be a wafer pattern oriented at 45 degrees with respect to the pixel edges in order to maximize the light coupling efficiency. A grating area 20 may be covered with a top contact metal 10 while individual pixels may be defined by etching isolating trenches down to but not through the bottom contact layer 40. The structure of FIG. 7A enables the electrical access of any given pixel through a single bump where the other contact is common to the entire array and may be accessed along with the periphery of the detector assembly. An entire 320×256 hybridized array 100 may be diced and hybridized to a matching ROIC 60 via indium bumps 70 where one bump coordinates with each pixel. The interface between the array 100 and the ROIC 60 may be mechanically reinforced by means of an epoxy wicked into the gap between the two. The substrate may be then chemically and mechanically removed down to the etched stop layer 50 that ultimately allows light to enter the array from what was the substrate side. The process to create the hybridized array 100 follows the sequence of steps used to fabricate known single colored QWIP imaging arrays. The present invention, however, includes individual pixels that are not defined by a standard dry etch, but are created with a wet chemical etch that produces sloping sidewalls. The technique of the present invention enhances both the magnitude and the spectral width of the optical coupling mechanism at the cost of a modest reduction in optical fill factor.

Figure 6B:
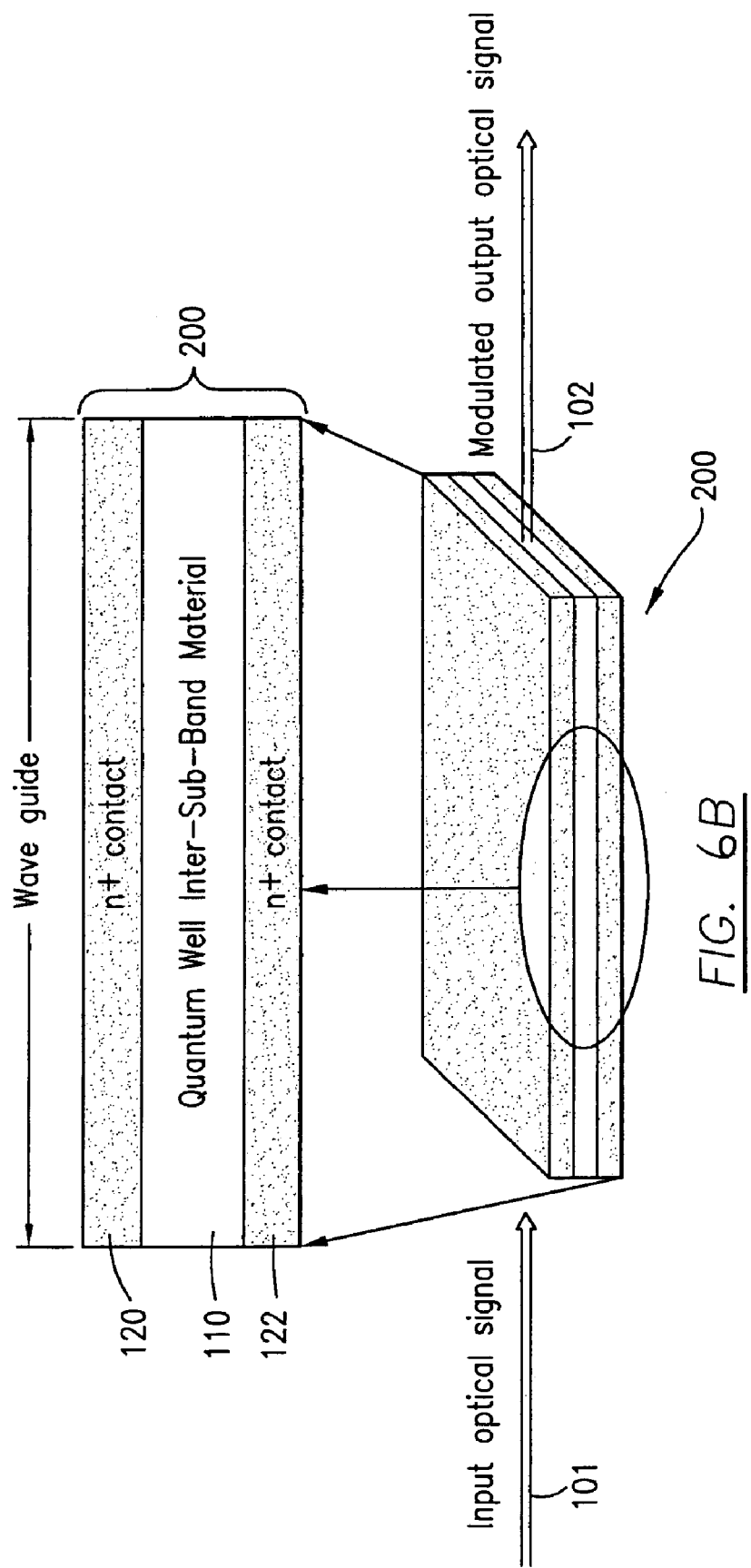
FIG. 6B shows an exemplary wave guide configuration for a modulator array according to the present invention.
Figure 6C:
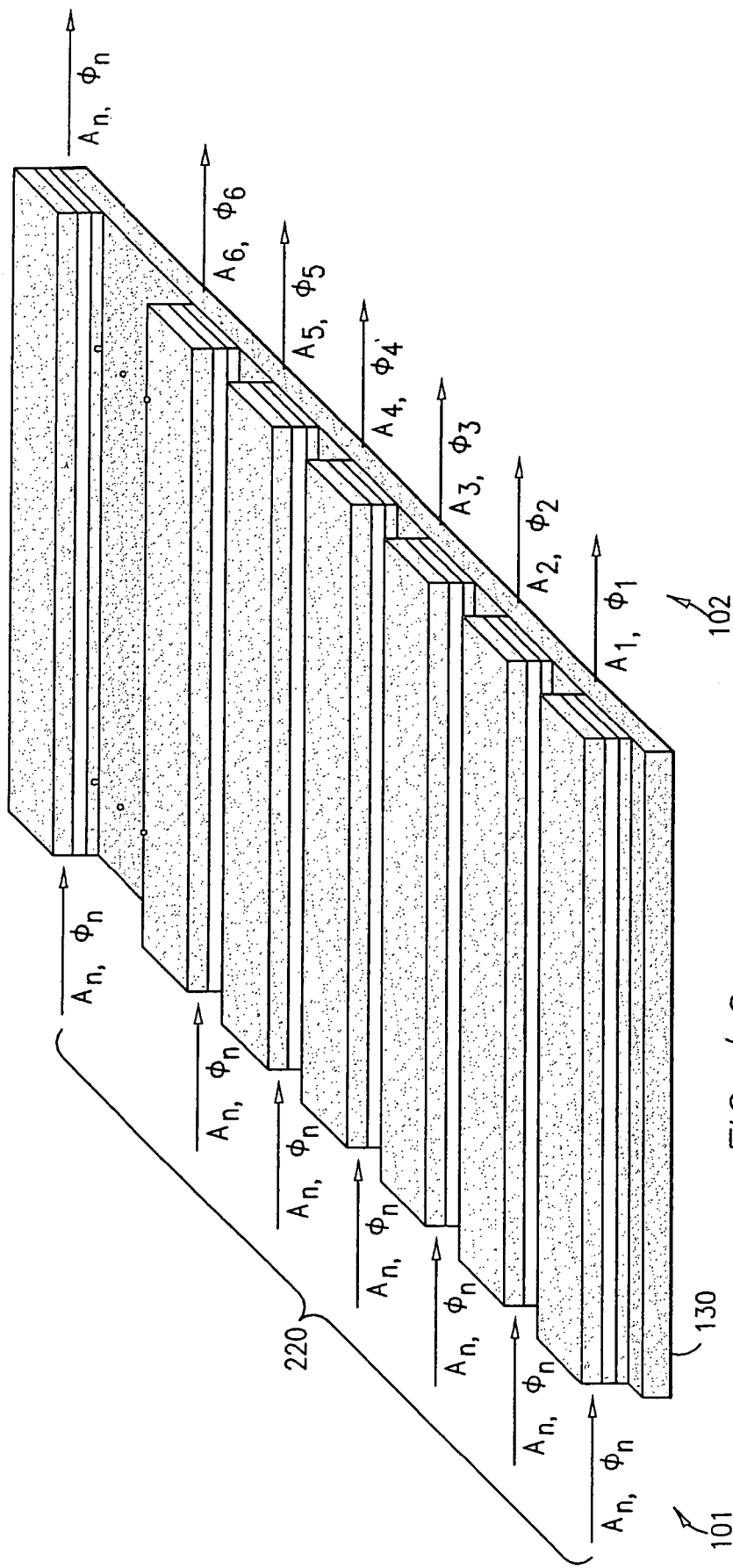
FIG. 6C shows an exemplary linear array according to the present invention.
Figure 6D:
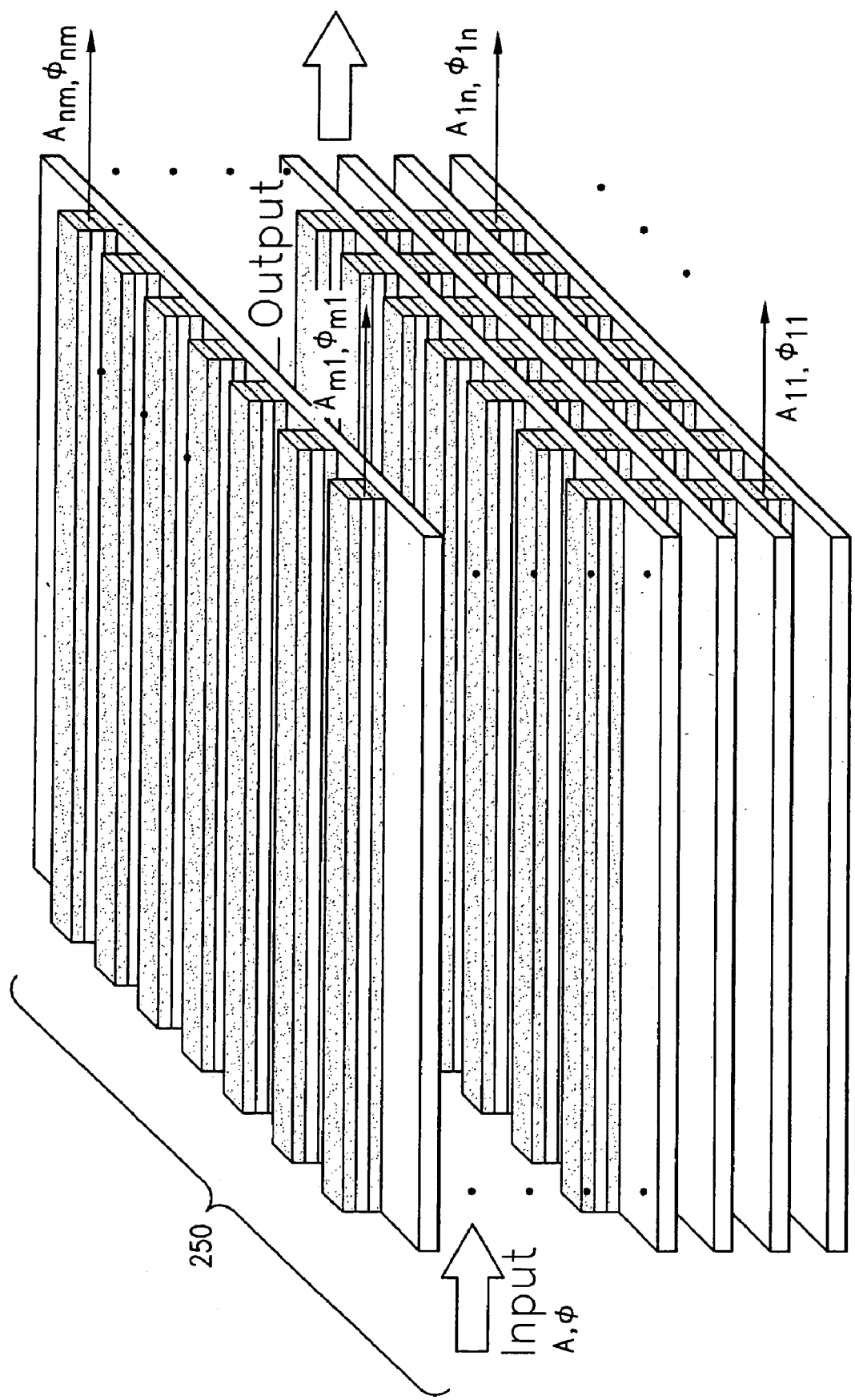
FIG. 6D shows an exemplary two dimensional array according to the present invention.
Figure 6E:
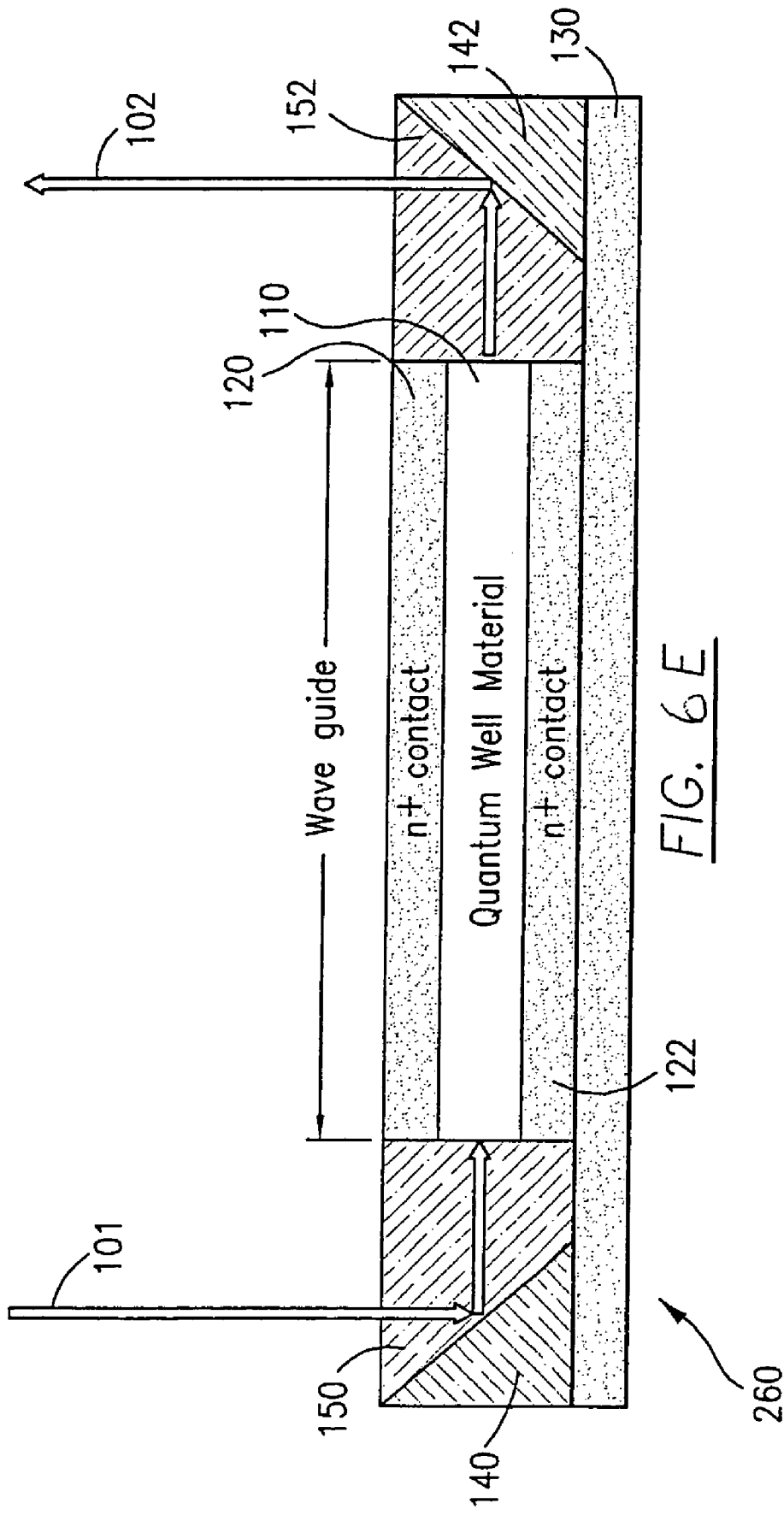
FIG. 6E shows an exemplary wave guide cell for a two dimensional reflective array according to the present invention.

Referring now to FIG. 6B, another exemplary array is shown for the present invention. FIG. 6B shows a wave guide configuration for a modulator array where an input optical signal 101 enters wave guide 200 and exits as a modulated optical signal 102. The wave guide 200 includes a quantum well 110 between two n+ contacts 120, 122. A plurality of wave guides may be configured into a linear array, as shown in FIG. 6C. The wave guides are placed onto a substrate 130 and enable the modulation of light through the linear array 220. The wave guides of the array 220 may be individually controlled in order to modulate light traveling through the wave guides. A two dimensional array 250 may also created with a plurality of waveguides as shown in FIG. 6D. The two dimensional array 250 may be created by stacking linear arrays vertically and transmitting light through the respective wave guides in order to affect light modulation. FIG. 6E shows a wave guide cell that may be used as a two dimensional reflective array 260. The core of the reflective array 260 is similar to the linear array 200, where quantum well material 110 is placed between n+ contacts 120, 122 upon the substrate 130. The light 101 enters this reflective array 260 and reflects off of a coupling mirror 140 into the quantum well material 110. The modulated light exits quantum well 110, reflects off of a second coupling mirror 142 and exits the reflective array 260.

The instant invention has been shown and described herein in what is considered to be the most practical and preferred embodiment. It is recognized, however, that departures may be made therefrom within the scope of the invention and that obvious modifications will occur to a person skilled in the art.

What is claimed is:

1. A coherent optical beam modulating device comprising: an optical modulator array, where said optical modulator array includes an asymmetric stepped quantum well doped with electrons, wherein the modulator array operates as at least one of a phase modulator and a light intensity modulator base upon a voltage bias applied across the modulator array, and where the voltage bias influences a detected spectrum's intersubband separation.

2. The coherent optical beam modulating device according to claim 1, wherein an excited state of the stepped quantum well changes with the voltage bias.

3. The coherent optical beam modulating device according to claim 2, wherein the asymmetric stepped quantum well is a hybridized array.

4. The coherent optical beam modulating device according to claim 3, where the hybridized array includes a plurality of pixels that define a grating.

5. The coherent optical beam modulating device according to claim 4, where the grating has a waffle pattern, where said waffle pattern is oriented at 45° with respect to the pixel edges.

6. The coherent optical beam modulating device according to claim 3, where said hybridized array uses a finite size of pixels with a finite number of grating periods.

7. The coherent optical beam modulating device according to claim 3, where the hybridized array includes a plurality of wet etched pixels.

8. The coherent optical beam modulating device according to claim 2, wherein the asymmetric stepped quantum well is at least one of a linear array, a two dimensional array and a reflective array.

9. A system for coherent optical beam modulating comprising:
 a coherent optical signal, where the optical signal is at least one of a transmitted signal and a reflected signal; and
 at least one modulating array includes an asymmetric stepped quantum well capable of reflecting and transmitting the optical signal, where the at least one modulating array continuously affects a detected spectrum's intersubband separation with respect to a voltage bias applied across the at least one modulating array.

10. The system for coherent optical beam modulating according to claim 9, where the at least one array is a hybridized array, where the hybridized array includes a plurality of pixels that define a grating.

11. The system for coherent optical beam modulating according to claim 10, where the hybridized array includes a plurality of wet etched pixels that define a grating.

12. The system for coherent optical beam modulating according to claim 9, where the at least one array includes at least one of a linear array, a two dimensional array and a reflective array.

* * * * *